United States Patent
Rupert et al.

(10) Patent No.: US 11,372,441 B2
(45) Date of Patent: Jun. 28, 2022

(54) ZERO OFFSET CLOCK DISTRIBUTION

(71) Applicant: Integrated Device Technology, Inc., San Jose, CA (US)

(72) Inventors: Michael John Rupert, Ottawa (CA); Ernst J G den Broeder, Stittsville (CA); Leonid Goldin, Ottawa (CA)

(73) Assignee: Integrated Device Technology, Inc., San Jose, CA (US)

( * ) Notice: Subject to any disclaimer, the term of this patent is extended or adjusted under 35 U.S.C. 154(b) by 377 days.

(21) Appl. No.: 16/521,217

(22) Filed: Jul. 24, 2019

(65) Prior Publication Data
US 2020/0033909 A1 Jan. 30, 2020

Related U.S. Application Data

(60) Provisional application No. 62/703,739, filed on Jul. 26, 2018.

(51) Int. Cl.
| | | |
|---|---|---|
| *G06F 1/10* | (2006.01) | |
| *G06F 1/03* | (2006.01) | |
| *H03L 7/07* | (2006.01) | |
| *G06F 1/12* | (2006.01) | |

(52) U.S. Cl.
CPC ............ *G06F 1/10* (2013.01); *G06F 1/0335* (2013.01); *G06F 1/12* (2013.01); *H03L 7/07* (2013.01)

(58) Field of Classification Search
None
See application file for complete search history.

(56) References Cited

U.S. PATENT DOCUMENTS

| | | |
|---|---|---|
| 10,075,284 B1 | 9/2018 | Rodrigues et al. |
| 10,904,048 B2 * | 1/2021 | Durairaj .............. H03K 5/003 |
| 2018/0159541 A1 | 6/2018 | Spijker |
| 2021/0133133 A1 * | 5/2021 | Seger, Jr. ............ G06F 13/36 |

FOREIGN PATENT DOCUMENTS

| | | |
|---|---|---|
| CN | 102088327 A | 6/2011 |
| CN | 106130710 A | 11/2016 |
| EP | 1684519 A2 | 7/2006 |

OTHER PUBLICATIONS

Office action dated Oct. 28, 2020 issued in related Chinese patent application No. 201910687714.7 (19 pages).
European Communication with European Search Report for European Application No. 19188641.5, dated Nov. 22, 2019, pp. 1-8.

* cited by examiner

*Primary Examiner* — Cassandra F Cox
(74) *Attorney, Agent, or Firm* — Haynes and Boone, LLP.

(57) ABSTRACT

A method of distributing clock signals includes receiving a plurality of clock signals into a corresponding plurality of processing blocks; determining frequency offset data between a first clock signal of the plurality of clock signals and each of the other clock signals of the plurality of clock signals; periodically determining phase offset data between the first clock signal and the other clock signals; and transmitting the first clock signal, the frequency offset data, and the phase offset data on a pulse-width modulated clock signal. The method includes receiving a modulated clock signal, the modulated clock signal include a carrier clock signal, a frequency offset data, and a phase offset data on a pulse-width modulated clock signal; and recovering a plurality of clock signals based on the first clock signal, the frequency offset data, and the phase offset data.

9 Claims, 2 Drawing Sheets

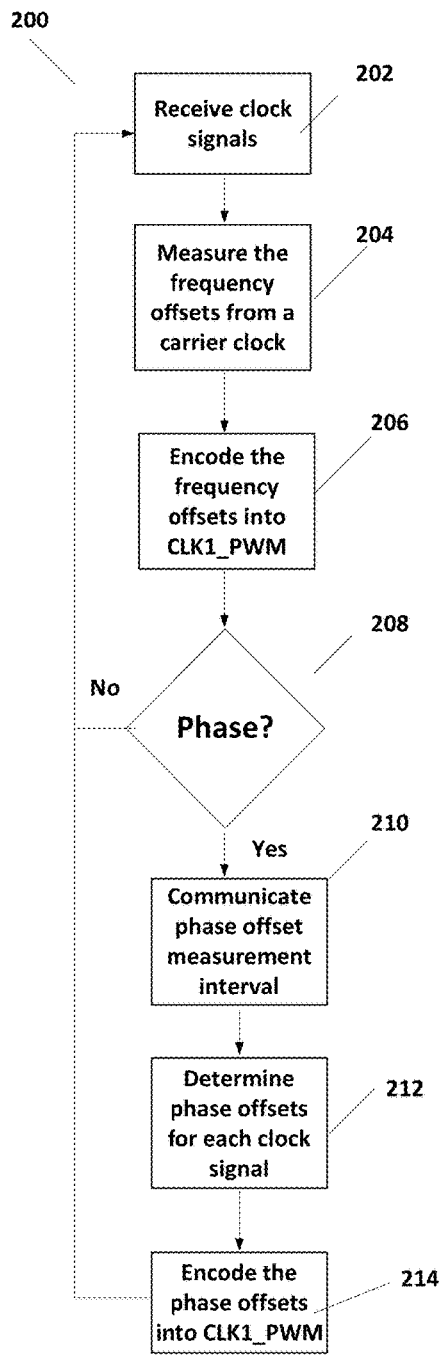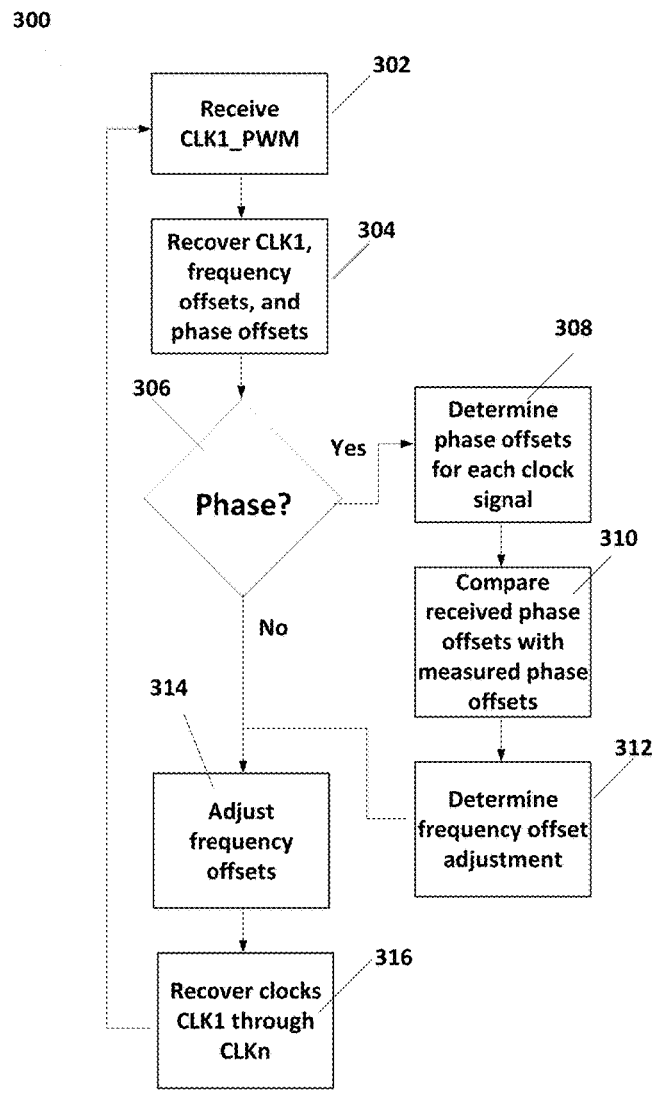
Figure 2
Figure 3

ZERO OFFSET CLOCK DISTRIBUTION

RELATED APPLICATION

This disclosure claims priority to U.S. Provisional Application Ser. No. 62/703,739, which was filed on Jul. 26, 2018, which is herein incorporated by reference in its entirety.

TECHNICAL FIELD

Embodiments of the present invention are related to network systems that employ distributed clock frequencies, and in particular to zero offset clock distribution in such systems.

DISCUSSION OF RELATED ART

Many network systems utilizing multiple clocks with multiple frequencies throughout the network. Distribution of these clock signals, each with its own frequency, throughout the network is therefore important for operation of the network. These clocks include, for example, individual clocks for T1/E1 in Synchronize Optical Networking (SONET)/Synchronous Digital Hierarchy (SDH) networks, the various clock signals in Asynchronous Transfer Mode (ATM) networks and the various clock signals in Optical Transport Networks (OTN). Current methods of achieving clock accuracy no longer provide sufficiently accurate clock signals to meet the more precise timing requirements of modern networks.

Therefore, there is a need to develop systems that can provide better clock signal accuracy throughout a network.

SUMMARY

In accordance with some embodiments of the present invention, a method of distributing clock signals includes receiving a plurality of clock signals into a corresponding plurality of processing blocks; determining frequency offset data between a first clock signal of the plurality of clock signals and each of the other clock signals of the plurality of clock signals; periodically determining phase offset data between the first clock signal and the other clock signals; and transmitting the first clock signal, the frequency offset data, and the phase offset data on a pulse-width modulated clock signal. A receiving method includes receiving a modulated clock signal, the modulated clock signal include a carrier clock signal, a frequency offset data, and a phase offset data on a pulse-width modulated clock signal; and recovering a plurality of clock signals based on the first clock signal, the frequency offset data, and the phase offset data. Recover the clock signals includes comparing the phase offset data with receiver phase offset data and generating an adjustment to the frequency offset data based on the comparison.

A network system according to some embodiments includes a transmitting device, the transmitting device providing a modulated clock signal that includes a first clock signal, frequency offset data indicating the difference in frequency between the first clock signal and one or more second clock signals, and phase offset data indicating phase difference between the one or more second clock signals and the first clock signal over a specific time period; and a receiving device, the receiving device receiving the modulated clock signal and recovering the frequency offset data and phase offset data, determining receiver phase offset data, comparing the receiver phase offset data and the phase offset data to generate an adjustment to the frequency offset data, and recovering the one or more second clock signals.

These and other embodiments are further discussed below with respect to the following figures.

BRIEF DESCRIPTION OF THE DRAWINGS

FIG. 2 illustrates a process for operation on a transmitting device according to some embodiments.

FIG. 3 illustrates a process for operation on a receiving device according to some embodiments.

DETAILED DESCRIPTION

Figure 1:
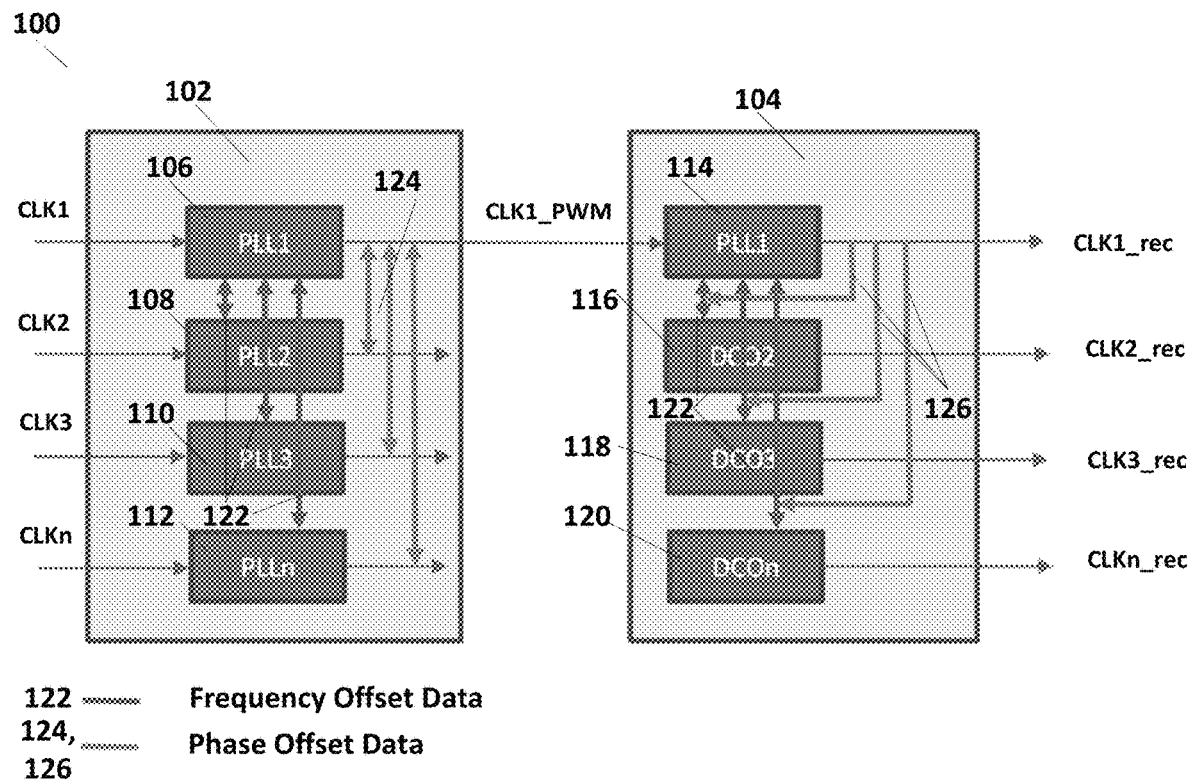
FIG. 1 illustrates distribution of clocks according to some embodiments.

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Embodiments of the present invention provide differential timing to distribute multiple frequencies. In the differential timing method, frequency offset data is determined between each of the clock signals and a carrier signal, which is one of the clock signals, in a transmitting device and that frequency offset data is transmitted by pulse-width modulation on the carrier signal. The clock signals can then be recovered at a receiving device. To further correct for additional errors, periodically the transmitting device and the receiving device measure phase offset data that compares over a period of time the phase of each clock signal with that of the carrier signal. The phase offset data measured by the transmitting device is transmitted on the carrier signal to the receiving device. A comparison between the phase offset data measured by the transmitting device and the phase offset data measured by the receiving device is then used to determine a frequency offset adjustment. The clocks then use the frequency offset adjustment with the frequency offset data to recover the clock signals.

Distribution of multiple frequencies in a network is required by many applications. Such application can, for example, include individual clock signals for T1/E1 in Synchronized Optical Networking (SONET)/Synchronous Digital Hierarchy (SDH) networks, clock recovery in Asynchronous Transfer Mode (ATM) networks, and clock recovery in Optical Transport Network (OTN) networks. Distribution of the multiple frequencies of clock has been achieved by using differential methods, where each individual clock was compared to the carrier frequency and the difference was carried over either direct differential information or methods like bit/byte stuffing. These methods were accomplished using digital measurements, where at least part of the recovered frequency error is caused by the finite precision of the digital calculations (quantization error). The differential methods did not have any feedback and the quantization error was therefore not corrected. The recovery error was much smaller than usual operation required and therefore was ignored.

However, with more precise timing requirements in current systems, there is a need to make sure that the recovered clock signal is matches more precisely the clock signal from which it originated. Examples of systems that use highly precise timing requirements include systems operating with synchronized Ethernet (SyncE) and precision time protocol (PTP) clocks in modern networks. These clocks can vary be up to one part in $10e$-$11$ over time. If the clocks are not distributed in the system exactly, the time alignment requirements of the network cannot be met.

The challenge, therefore, is to distribute multiple clock signals of differing frequencies in the multi-card chassis of network elements (NEs). Most NEs were designed for a single clock distribution and therefore have a single clock line between cards. If multiple clock signals are required, they may be recovered using differential methods, which carries the the inherent error caused by quantization as discussed above.

Embodiments of the present invention utilizes basic method of differential clocking augmented by periodic precise measurements of phase difference between two or more clock signals. The differential clocking carries the frequency difference with finite accuracy. The phase offset measurement is carried as a separate information and compared with the phase difference at the destination. The recovered clock signal can be corrected with a phase offset measured during the process.

FIG. 1 illustrates a system 100 according to some embodiments. System 100 operates to distribute multiple clock signals. In particular, FIG. 1 illustrates a clock transmission device 102 and a clock receiver device 104. Clock transmission device 102 and clock receive device 104 may be different NEs in the network. Transmission device 102 receives multiple clock signals, clock signals CLK1 through CLKn as illustrated in FIG. 1. Clock signals CLK1 through CLKn are received in processing blocks 106 through 112, each of which can include a phase-locked loops PLL1, PLL2, PLL3 through PLLn, respectively. Each of processing blocks 106 through 112 determines a frequency offset between its corresponding clock signal and a first clock signal, in this example CLK1. As illustrated in FIG. 1, frequency offset data 122 is communicated to processing block 106 from each of block 108, through block 112. Block 106 then encodes the frequency offset data 122 into the clock signal CLK1 to generate the signal CLK_PWM. The signal CLK_PWM is then communicated to receive device 104. Frequency offset data 122 can be encoded onto the clock signal output from the PLL in block 106 using a pulse-width modulated (PWM) mechanism to generate the signal CLK1_PWM.

As is further illustrated in FIG. 1, receive device 104 includes processing blocks 114 through 120. Processing block 114 receives the signal CLK1_PWM and includes a PLL to provide the recovered CLK1, CLK1_rec. Block 114 further recovers data that was encoded onto the CLK1_PWM signal. Using frequency offset data 122, which is embedded in the clock signal CLK1_PWM, processing blocks 116 through 120, each of which includes digitally controlled oscillators DCO2, DCO3, through DCOn 120, respectively, to recover received clock signals CLK2_rec through CLKn_rec based on CLK1_rec.

Consequently, as discussed above, one clock signal (CLK1 in FIG. 1) is selected as a carrier. Frequency offset data 122 between the other clock signals CLK2 through CLKn are determined in processing blocks 108 through 112 as measured with respect to the carrier clock frequency CLK1. The frequency offset data 122 is conveyed on the signal CLK1_PWM generated by processing block 106 by using PWM mechanism on the carrier clock, which eliminates need of a separate data channel. At the receiving side on receiver 104, the carrier clock CLK1 is used as a reference input and drives assigned a PLL in processing block 114. The frequency offset data 122 is also recovered in block 114 and provided to processing blocks 116, 118, through 120, which in combination with the recovered CLK1 signal recovers the remaining clock signals CLK2_rec through CLKn_rec. This keeps generation of all of the clock signals synchronized to produce synchronized clock signals CLK1_rec through CLKn_rec. As discussed above, the frequency difference information is digitally transferred to other blocks 116, 118, and 120 from block 114, which adjusts output frequencies from the recovered frequency CLK1_rec accordingly.

Transmitting device 102 and receiving device 104 can each include one or more controllers that perform the functions described above with respect to PLLs 106-112 or PLL 114 and DCOs 116-120. The one or more processors can include memory (volatile and nonvolatile) sufficient to store data and instructions for operation of one or more processors. Transmitting device 102 and receiving device 104 may also include digitization circuitry to generate digital signals associated that can be operated on by the processors.

However, as discussed above, due to discrete nature of digital system the recovered output frequencies will include quantization error. For example, if the granularity of the information is 1 unit, then the data will be transferred in integer values. If the actual offset is 0.001 units then this offset error will be seen by the receiver as 0 and these errors will not be corrected.

Embodiments of the present invention uses phase offset measurements between clocks at the transmitting device 102, phase offset data 124, and phase offset data 126 at the receiving device 104. As illustrated in FIG. 1, phase offsets in transmitting device 102 can be calculated in processing blocks 108, 110 through 112 over a particular time period. Phase offsets in receiving device 104 can be calculated over the same particular time period (usually measured relative to CLK1) in processing devices 116, 118, and 120. The measurements of phase offset are done at the beginning and the end of measuring interval at each of transmitting device 102 and receiving device 104. The difference between these measurements shows phase offset movement. The measurements are done with the same interval on both sides and synchronized via messaging encoded in the signal CLK1_PWM. The results are compared at receiver device 104. If the phase offset movement on receiver 104 is not equal to the phase offset measured at transmitter device 102, then the output frequency at the receiver device 104 does not precisely match the correlated frequency of the clock signals at transmitter 102. At which point, receiver device 104 provides for an adjustment to the frequency offset data for each clock signal to adjust for the phase drift.

FIGS. 2 and 3 further illustrates operation of transmit device 102 and receive device 104 according to some embodiments of the present invention. FIG. 2 illustrates a process 200 according to some embodiments of the present invention. Process 200 is operated on transmitter device 102 as illustrated in FIG. 1. As illustrated in FIG. 2, in step 202 the clock signals CLK1 through CLKn are received in processing blocks 106 through 112 of FIG. 1. In step 204, one of the clock signals, in FIG. 1 CLK1, is designated as the carrier clock signal and frequency offsets are determined for each of the other clock signals from the carrier clock signal. In step 206, the frequency offsets are encoded into the output signal CLK1_PWM using pulse-width modulation encoding. As discussed above, periodically phase offsets are determined for each of the clock signals CLK1 through CLKn. In step 208, it is determined whether or not it is time to determine these phase offsets. If not, then process 200 returns to step 202.

If it is time for a phase determination, then process 200 provides a communication on the output signal CLK1_PWM to signal start and length of a phase determination period in step 210. In step 212, the phase determination between each clock signal and the carrier clock signal after a particular time interval is determined. The phase determinations for each of the clock signals is then encoded into the output signal CLK1_PWM in step 214. After step 214, then process 200 returns to step 202.

FIG. 3 illustrates a process 300 that operates on receive device 104 as illustrated in FIG. 1. In step 302, process 300 receives the signal CLK1_PWM from transmit device 102. As discussed above, CLK1_PWM includes the carrier clock signal, frequency offset data 122, and phase offset data 124, which is recovered in step 304. If a phase measurement interval is signaled in the data received by CLK1_PWM, in step 306 process 300 proceeds to step 308. In step 308, phase offsets 126 is determined over the same interface that phase offsets 124 are determined in transmitter device 102. In step 310, the phase offsets 124 as received in received signal CLK1_PWM is compared with the phase offset 126 as measured in receive device 104. A difference indicates an error in the frequency offsets 122 that were received. As such, in step 312, an adjustment for each CLK2 through CLKn to the frequency offset data 122 is determined. If it is not determined that a new phase measurement is signaled in step 306, or after step 312, then in step 314 each of the frequency offset data 122 received from the CLK1_PWM signal is offset by the current adjustment. Finally, in step 316, each of the clock signals CLK1 through CLKn is determined in processing blocks 114 and blocks 116-120, as discussed above, from the frequency offset data adjusted according to the difference between the phase offset data 126 measured in receive data 104 and the phase offset data 124 measured in transmit device 102 is made.

The measurements are repeated all the time. The new correction values are added to the latest available frequency offset for each of the clock signals CLK1 through CLKn to provide for CLK1_rec through CLKn_rec. In this fashion, additional errors due to, for example, quantum errors can be corrected.

It should be understood that FIGS. 2 and 3 are illustrative only and the receipt and processing of clock signals in transmit device 102 and the encoding of various data with the carrier clock to generate the output signal CLK1_PWM is a continuous process. Consequently, the steps shown in FIG. 2 can be performed concurrently. Similarly, in FIG. 3, the receipt of the signal CLK1_PWM and receipt of the encoded data on CLK1_PWM occurs continuously and consequently the steps for processing that data to arrive at the recovered clock signals CLK1_rec through CLKn_rec can occur concurrently.

The above detailed description is provided to illustrate specific embodiments of the present invention and is not intended to be limiting. Numerous variations and modifications within the scope of the present invention are possible. The present invention is set forth in the following claims.

What is claimed is:

1. A method of distributing clock signals, comprising
receiving a modulated clock signal, the modulated clock signal include a carrier clock signal, a frequency offset data, and a phase offset data on a pulse-width modulated clock signal; and
recovering a plurality of clock signals based on the first clock signal, the frequency offset data, and the phase offset data,
wherein recovering the plurality of clock signals comprises
receiving a communication indicating a time period for determining phase offset data;
determining receiver phase offset data over the time period;
comparing the receiver phase offset data with the phase offset data received on the pulse-width modulated clock signal to generate comparison phase offset data;
determining an adjustment to the frequency offset data based on the comparison phase offset data; and
determining each of the clock signals based on the adjustment and the frequency offset data for each of the clock signals.

2. The method of claim 1, wherein the modulated clock signal is received in a first processing block, and further including:
in a second processing block, receiving a recovered carrier clock signal and frequency offset data corresponding to the second processing block from the first processing block, along with a frequency offset adjustment; and
recovering a clock signal corresponding to the second processing block from the recovered carrier clock signal, the frequency offset data, and the frequency offset adjustment.

3. A network transmitting device, comprising:
a plurality of processing blocks, each of the plurality of processing blocks receiving a corresponding plurality of clock signals,
wherein a first processing block of the plurality of processing blocks generates an output clock signal based on a first clock signal of the plurality of clock signals,
wherein each of the plurality of processing blocks except the first processing block compares a frequency of the first clock signal with a frequency of the corresponding one of the plurality of clock signals to generate frequency offset data,
wherein each of the plurality of processing blocks except the first processing block generates phase offset data comparing the corresponding one of the plurality of clock signals with the first clock signal over a specific time, and
wherein the first processing block encodes the frequency offset data and the phase offset data onto the output clock signal.

4. The network transmitting device of claim 3, wherein each of the plurality of processing blocks includes a phase-locked loop.

5. The network transmitting device of claim 3, wherein the first processing block encodes the frequency offset data and the phase offset data onto the output clock signal using pulse-width modulation.

6. A network receiving device, comprising:
- a first processing block that receives an input signal from a network receiving device, the input signal including a first clock signal, encoded frequency offset data, and encoded phase offset data, wherein the first processing block recovers the first clock signal and retrieves the encoded frequency offset data and the encoded phase offset data; and
- one or more second processing blocks coupled to the first processing block, the one or more second processing blocks receiving the first clock signal and the frequency offset data from the first processing block,
- wherein the one or more second processing blocks generates a frequency offset adjustment based on a comparison of the phase offset data received with the input signal and receiver phase offset data generated in the one or more second processing blocks, and
- wherein the one or more second processing blocks recover a corresponding clock signal from the first clock signal, the frequency offset data, and the frequency offset adjustment.

7. The network receiver device of claim 6, wherein the first processing block includes a phase-locked loop.

8. The network receiver device of claim 6, wherein the one or more second processing blocks include digitally controlled oscillators.

9. A network system, comprising:
- a transmitting device, the transmitting device providing a modulated clock signal that includes a first clock signal, frequency offset data indicating the difference in frequency between the first clock signal and one or more second clock signals, and phase offset data indicating phase difference between the one or more second clock signals and the first clock signal over a specific time period; and
- a receiving device, the receiving device receiving the modulated clock signal and recovering the frequency offset data and phase offset data, determining receiver phase offset data, comparing the receiver phase offset data and the phase offset data to generate an adjustment to the frequency offset data, and recovering the one or more second clock signals.

* * * * *